United States Patent
Naum et al.

(10) Patent No.: US 7,888,591 B2
(45) Date of Patent: Feb. 15, 2011

(54) SILICON-BASED PHOTOVOLTAIC CELL AND ITS RED LIGHT CONVERSION LAYER

(75) Inventors: Soshchin Naum, Changhua (TW); Wei-Hung Lo, Taipei (TW); Chi-Ruei Tsai, Taipei (TW)

(73) Assignee: Yong-Chi Wang, Taipei (TW)

( * ) Notice: Subject to any disclaimer, the term of this patent is extended or adjusted under 35 U.S.C. 154(b) by 294 days.

(21) Appl. No.: 12/124,003

(22) Filed: May 20, 2008

(65) Prior Publication Data

US 2009/0025792 A1   Jan. 29, 2009

(30) Foreign Application Priority Data

May 23, 2007   (TW) .............................. 96118307 A

(51) Int. Cl.
*H01L 31/00* (2006.01)
*H01L 25/00* (2006.01)

(52) U.S. Cl. ................... 136/254; 136/243; 136/252
(58) Field of Classification Search ....................... None
See application file for complete search history.

(56) References Cited

U.S. PATENT DOCUMENTS

| 2004/0191518 A1* | 9/2004 | Naito et al. ................. 428/407 |
| 2006/0158106 A1* | 7/2006 | Morii ......................... 313/504 |

* cited by examiner

*Primary Examiner*—Alexa D Neckel
*Assistant Examiner*—Shannon Gardner
(74) *Attorney, Agent, or Firm*—WPAT., P.C.; Justin King

(57) ABSTRACT

A silicon-based photovoltaic cell is disclosed having a red light conversion layer that absorbs ultraviolet rays, blue-purple or yellow-green light of the Sun's solar radiation and converts the absorption into a red, dark red and near infrared subband radiation. The maximum value of the solar radiation absorbed by the red light conversion layer is $\lambda=470\sim490$ nm, and the maximum value of the photoluminescent spectrum of the red light conversion layer is within the photosensitive spectral zone of said single-crystal silicon substrate $\lambda=700\sim900$ nm, i.e., in conformity with the optimal sensitivity area of silicon-based solar cells. The red light conversion layer has filled therein an ethyl acetoacetate or polycarbonate-based light-transmissive polymer that has evenly distributed therein a phosphor composed of $\alpha\text{-}Al_2O_3\text{—}Ti_2O_3$, having a quantum efficiency of 90%.

14 Claims, 6 Drawing Sheets

ANNEX 1
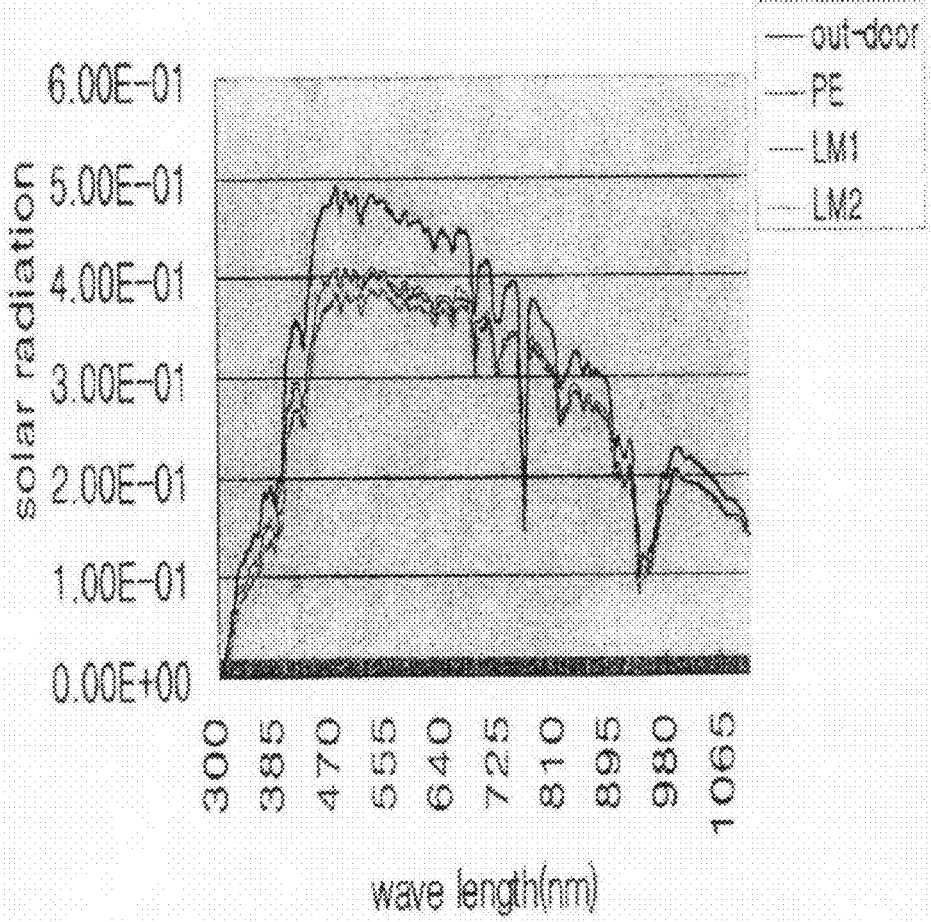

ANNEX 2
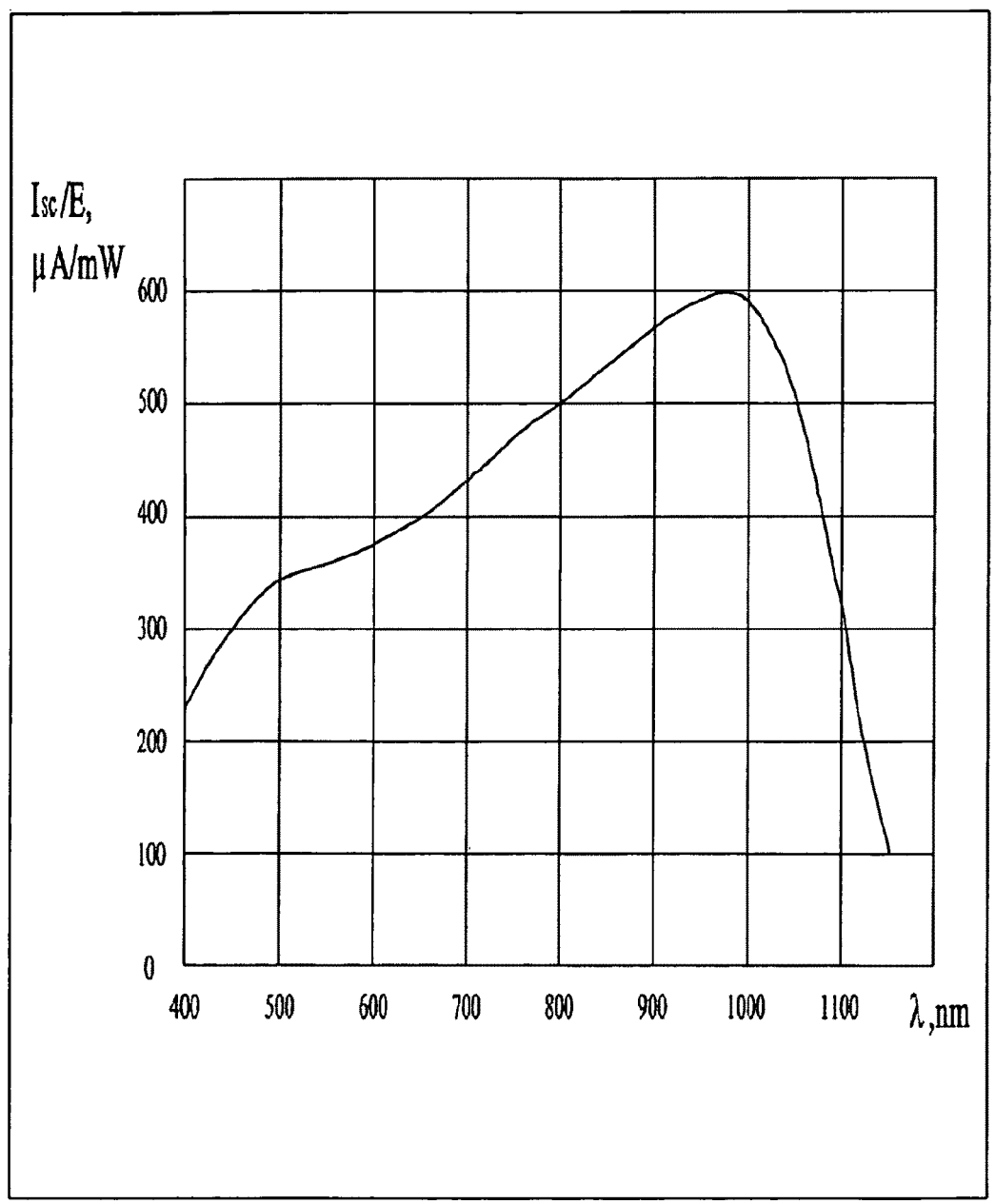

SILICON-BASED PHOTOVOLTAIC CELL AND ITS RED LIGHT CONVERSION LAYER

BACKGROUND OF THE INVENTION

1. Field of the Invention

The present invention relates to energy technology and more particularly, to a silicon-based photovoltaic cell that, unlike the natural resources of petroleum, natural gas and coal, enhances the photo conversion efficiency of the photovoltaic cell through a red light conversion layer thereon.

2. Description of the Related Art

Photovoltaic cell, more specifically, silicon-based photovoltaic cell is a self-provided energy intensively used in modern technology products such as mobile communication apparatus, microelectromechanical devices and lighting fixtures. For astro navigation, silicon-based photovoltaic cell is the only applicable energy source. Silicon-based photovoltaic cell technology is a special field having concern with the research of solar cell technology.

The design of a silicon-based solar cell started in mid twenty centuries, more specifically, the 1960's decade, when people were enthusiastic about exploring near-earth astro space. US, Soviet and Japanese scientists and engineers are the pioneering promoters of silicon-based photovoltaic cell. These early research results were edited into symposium proceedings (see "Semiconductor Radiation Energy Conversion", page 408, Moscow, Foreign Literature Publishing Co., Ltd, 1959). According to initial classification, people made the following categories: 1. Photoelectric energy converter; 2. Thermoelectric energy converter, and 3. Semiconductor electromagnetic converter.

FIG. 1 is a schematic drawing showing the structure of a regular silicon-based photovoltaic cell. As illustrated, the silicon-based photovoltaic cell is a device comprising a housing 10, a silicon substrate 20 accommodated in the housing 10, and a p-n junction film 30 on the surface of the silicon substrate 20. The aforesaid silicon-based photovoltaic cell generates energy when radiated by light 40. The aforesaid silicon-based photovoltaic cell further comprises an electrode system 50, a conversion layer 60, and a glass 70 covering the conversion layer 60.

Certain parameters may be applied to explain the characteristics of the silicon-based photovoltaic cell. These parameters include cell voltage V (Voltage), cell current J (Ampere), cell maximum supply power W (Watt), and the most important actual efficiency $\zeta$ (%).

As everybody knows, when the light of the sun is radiating the surface of the earth, the radiation energy power on the surface of the earth is 0.1 W/cm$^2$ or 1000 W/m$^2$. With respect to the actual efficiency of silicon-based photovoltaic cell, people estimate the ratio between the power of the cell can reach and the power of the sunlight acted upon the surface of the cell. Many scientific and patent literatures involve the research of the most important characteristic, i.e., the actual efficiency of silicon-based photovoltaic cell. According to huge amount of data computation, for example, use of p-n junctions for solar energy conversion issued by E. S. Rittner (see Phys. Rev. V96N6, 1708, 1954), the efficiency of a material having a wide constraint Eg=1.1 eV is about 25%. This theoretical value is regarded to be very accurate; therefore it shows no significant variation in the last five decades. Based on this theoretical value, a silicon-based photovoltaic cell of surface area 1 m$^2$ provides 250 W electric power under the power of sunlight 1000 W/m$^2$.

Because of high accuracy of the aforesaid theoretical value (see Phys. Rev. V96N6, 1708, 1954), the best silicon-based solar cells developed within the last five decades show the efficiency of 20~22% (please refer to data from web site www.comp.krit.ru/index.php). Industrial solar cells from many manufacturers around the world, such as "Sun Tech", "Motech" and etc., show an efficiency about 14.5~18%. The reason why the actual efficiency is not in conformity with the theoretical computational value is the objective studied in the present invention.

In order to point out the reason why the actual efficiency is not in conformity with the theoretical computational value, the invention compares two curves introduced in Annex I and Annex II. Annex I indicates the radiation of solar spectrum at 38 degrees North Latitude at mid-day in August. With respect to this curve, we made a professional measurement for the sake of excellent reproduction of the value of solar constant 0.1 W/cm$^2$ under these bandwidth and daytime conditions. The characteristics of the solar radiation spectral curve show the type of the extreme-value of the spectrum. The maximum value of the spectrum is at wavelength $\lambda$=473±5 nm. This maximum value does not change subject to change of the position and angle of the sun. Only atmospheric phenomena can alter the location of the extreme value, such as thick-fog, claudy and severe raining weather.

Annex II intruduces the nanometered wavelength of the radiation absorbed along transverse axis of coordinates in the silicon-based photovoltaic cell photosensitive spectrum curve, where the axis of coordinates has assigned rating $\mu$A/mW. The maximum value of the curve is $\lambda$=960~980 nm, and the photosensitivity is 600 $\mu$A/mW. At this time, the total photosensitivity at $\lambda$=400 nm is 230 $\mu$A/mW. The photosensitivity is higher when at the maximum value area of the solar spectrum. However, this value 320 $\mu$A/mW is much lower than the maximum value of silicon photo. The curves shown in Annex I and Annex II are different. Few researches on this matter are made. The applicant of the present invention made a study on this matter and filed an application in Taiwan under Application No. 096105011. This application discloses a compound conversion layer based from two phosphors. This conversion layer is activated by the solar light $\lambda_{max}$=470 n, and then gives off light at $\lambda$=580~590 nm. The first phosphor is activated by the wavelength of this luminance. The maximum activation value of the first phosphor is at the spectrum radiation $\lambda$=588 nm. The maximum value of the luminesce of the second phosphor is within $\lambda$=1000~1020 nm, i.e., close to the maximum value of the photosensitivity of a silicon-based photovoltaic cell. Based on this prime model, the efficiency of the photovoltaic cell is increased by 25~30%. Therefore, these silicon-based photovoltaic cells has high efficiency about 16~19.5%, undoubtly high realistic value.

Although the silicon-based photovoltaic cells and related conversion layers of the aforesaid techniques have a high efficiency value, they still has drawbacks: 1. The use of two phosphors in one conversion layer affects uniformity of the surface illumination of the silicon-based photovoltaic cell; and 2. The use of the second phosphor of radiation wavelength $\lambda$=990~1000 nm causes the silicon-based photovoltaic cell to produce heat.

SUMMARY OF THE INVENTION

The present invention has been accomplished under the circumstances in view. It is the main object of the present invention to provide a silicon-based photovoltaic cell having a red light conversion layer, which realizes the creation of high-efficiency silicon-based photovoltaic cells.

It is another object of the present invention to provide a silicon-based photovoltaic cell having a red light conversion layer, which increases the voltage range of silicon-based photovoltaic cells.

It is still another object of the present invention to provide a silicon-based photovoltaic cell having a red light conversion layer, which increases the short-circuit current of silicon-based photovoltaic cells.

To achieve these and other objects of the present invention, the invention provides a silicon-based photovoltaic cell that comprises a single-crystal silicon substrate, a glass covered on the silicon substrate, and a conversion layer sandwiched between the single-crystal silicon substrate and the glass, wherein the conversion layer absorbs ultraviolet rays, blue-purple or yellow-green light of the Sun's solar radiation and converts the absorption into a photoluminescent light; the conversion layer absorbs the maximum value of the Sun's solar radiation so that the maximum value of the photoluminescent spectrum of the conversion layer is within the photosensitive spectral zone of the single-crystal silicon substrate.

Further, the glass is a decolorized frontal glass.

Further, the photoluminescent light is located within the orange, red, near-infrared and mid-infrared subband of electromagnetic spectrum.

Further, the maximum value of the solar radiation absorbed by the conversion layer is $\lambda=470\sim490$ nm.

Further, the maximum value of the photoluminescent spectrum of the conversion layer is within the photosensitive spectral zone of the single-crystal silicon substrate $\lambda=700\sim900$ nm.

Further, the conversion layer is formed of a nanometered oxygen-contained inorganic phosphor, which is prepared from elements of the chemistry's periodic table, Groups IIIA and IVA that have a cubic crystal structure so that the geometric size of the phosphor is smaller than the wavelength of the light radiated thereon, i.e., $d_{cp)phosphor} < \lambda_{light}$.

Further, the conversion layer has filled therein an ethyl acetoacetate or polycarbonate-based light-transmissive polymer that has evenly distributed therein a phosphor composed of $\alpha\text{-}Al_2O_3\text{—}Ti_2O_3$ at the volume concentration of 0.05~5%.

Further, the conversion layer has added thereto titanium ions as an activator in which the degree of oxidization is $Ti^{+3}$.

Further, the frontal portion of the silicon-based photovoltaic cell has blue-light green color, and the absorption efficiency of the silicon-based photovoltaic cell for grade 1 solar radiation is $\geqq 60\sim75\%$.

Further, the conversion layer increases the effective utilization of solar radiation by 15~28%.

To achieve these and other objects of the present invention, the invention provides a red light conversion layer for silicon-based photovoltaic cell that absorbs ultraviolet rays, blue-purple or yellow-green light of the Sun's solar radiation and converts the absorption into a photoluminescent light. The conversion layer absorbs the maximum value of the Sun's solar radiation so that the maximum value of the photoluminescent spectrum of the conversion layer is within the photosensitive spectral zone of the single-crystal silicon substrate.

Further, the photoluminescent light is located within the orange, red, near-infrared and mid-infrared subband of electromagnetic spectrum.

Further, the maximum value of the solar radiation absorbed by the conversion layer is $\lambda=470\sim490$ nm.

Further, the red light conversion layer is formed of a nanometered oxygen-contained inorganic phosphor, which is prepared from elements of the chemistry's periodic table, Groups IIIA and IVA that have a cubic crystal structure so that the geometric size of the phosphor is smaller than the wavelength of the light radiated thereon, i.e., $d_{cp)phosphor} < \lambda_{light}$.

Further, the red light conversion layer has filled therein an ethyl acetoacetate or polycarbonate-based light-transmissive polymer that has evenly distributed therein a phosphor composed of $\alpha\text{-}Al_2O_3\text{—}Ti_2O_3$ at the volume concentration of 0.05~5%.

Further, the red light conversion layer has added thereto titanium ions as an activator in which the degree of oxidization is $Ti^{+3}$.

Further, the red light conversion layer increases the effective utilization of solar radiation by 15~28%.

Annex I indicates the radiation of solar spectrum at 38 degrees North Latitude at mid-day in August.

Annex II intruduces the nanometered wavelength of the radiation absorbed along transverse axis of coordinates in the silicon-based photovoltaic cell photosensitive spectrum curve, where the axis of coordinates has the assigned rating $\mu A/mW$.

DETAILED DESCRIPTION OF THE PREFERRED EMBODIMENT

Figure 1:
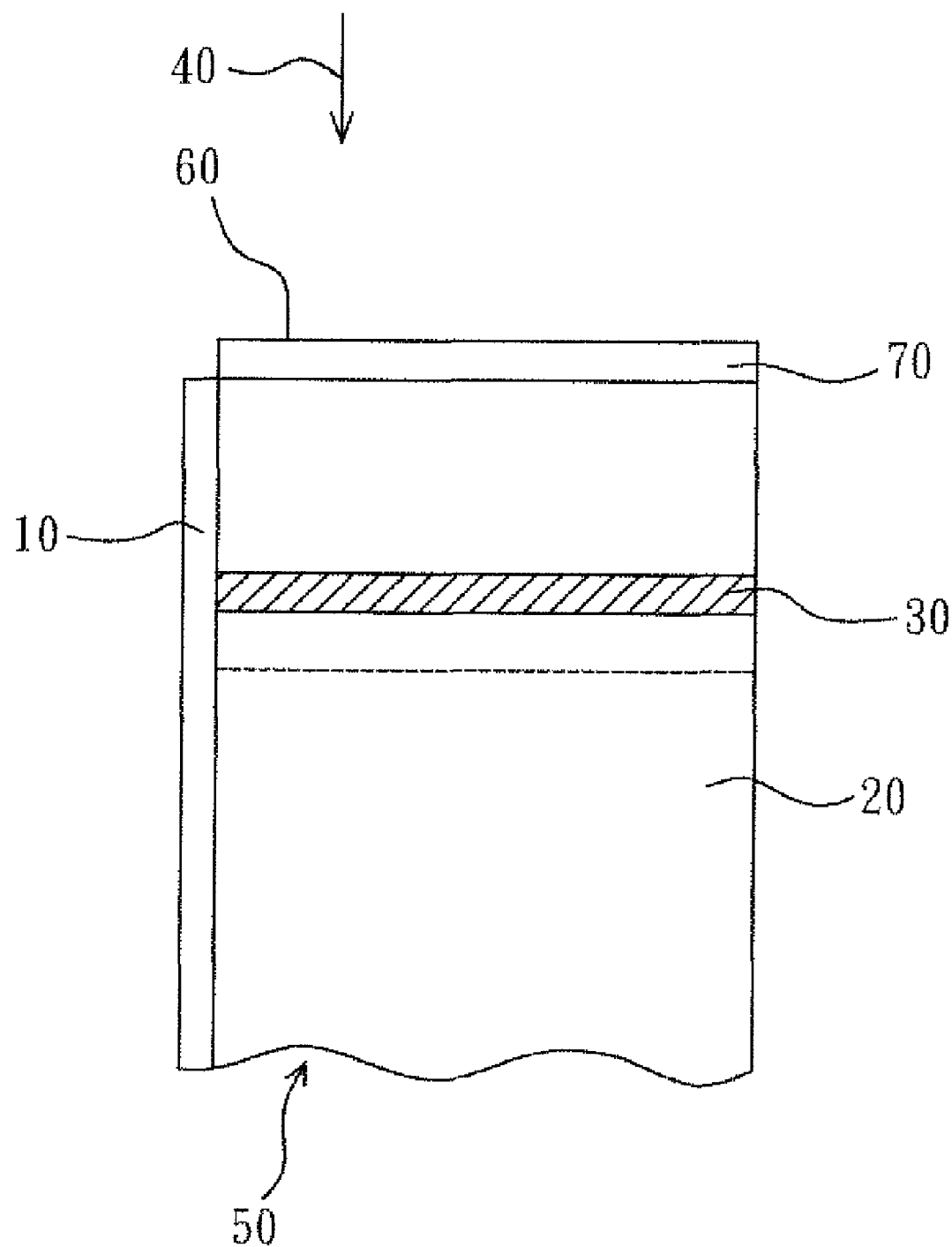
FIG. 1 is a schematic drawing showing the basic architecture of a conventional photovoltaic cell.
Figure 2:
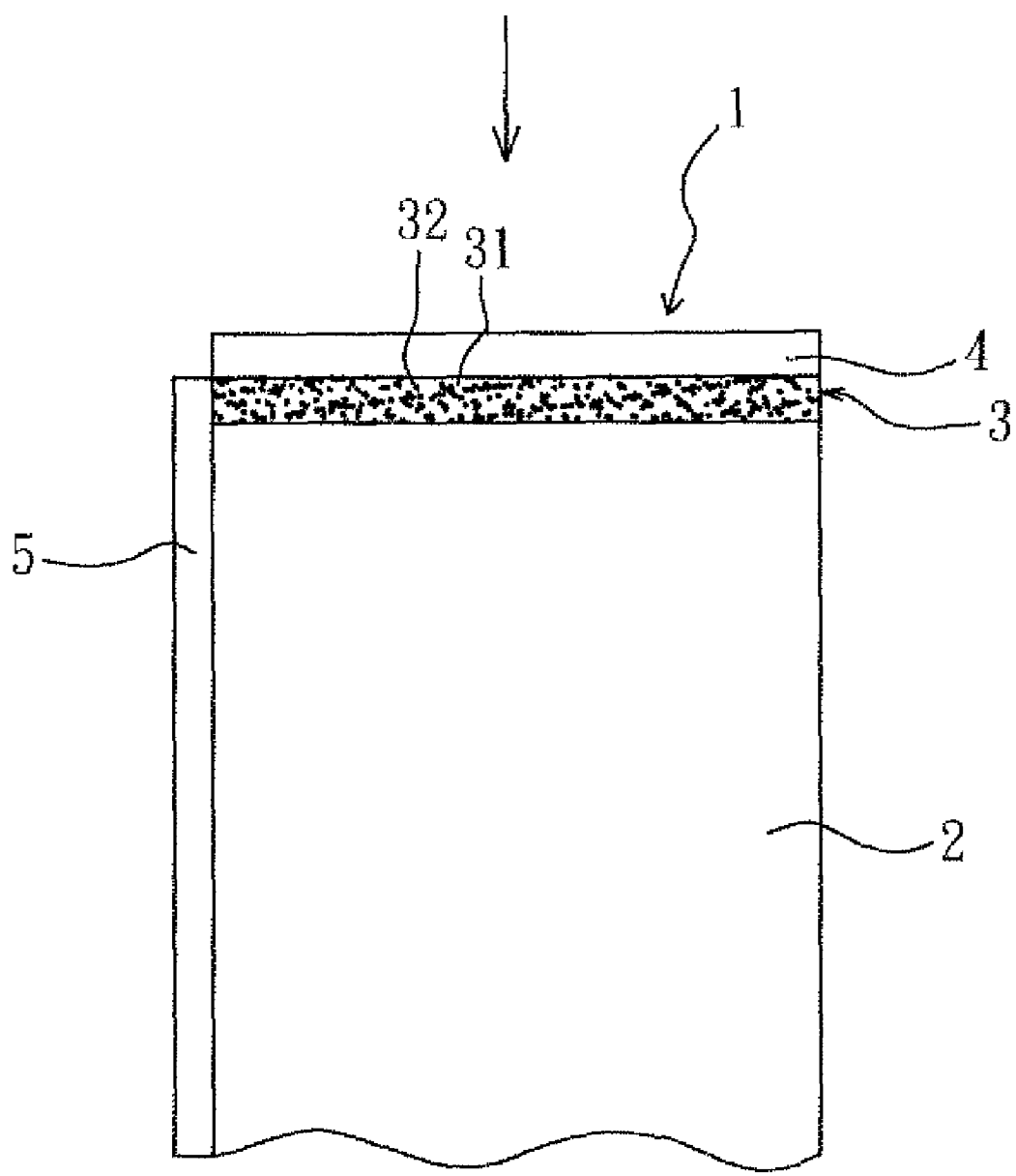
FIG. 2 is a schematic drawing showing the basic architecture of a silicon-based photovoltaic cell according to the present invention.

At first, the object of the present invention is to eliminate the drawbacks of the aforesaid prior art silicon-based photovoltaic cell. In FIG. 2, to achieve this object, a silicon-based photovoltaic cell 1 in accordance with the present invention is shown comprising a silicon substrate 2, a glass 4 covered on the silicon substrate 2, and a conversion layer 3 sandwiched between the silicon substrate 2 and the glass 4, characterized in that the conversion layer 3 absorbs ultraviolet rays, blue-purple or yellow-green light of the Sun's solar radiation and converts the absorption into a photoluminescent light, and is capable of absorbing the maximum value of the Sun's solar radiation so that the maximum value of the photoluminescent spectrum of the conversion layer 3 is within the photosensitive spectral zone of the single crystal silicon;

wherein the glass 4 can be a decolorized frontal glass;

wherein the photoluminescent light is located within the orange, red, near-infrared and mid-infrared subband of electromagnetic spectrum;

wherein the maximum value of the solar radiation absorbed by the conversion layer 3 is $\lambda=470\sim490$ nm;

wherein the maximum value of the photoluminescent spectrum of the conversion layer 3 is within the photosensitive spectral zone of the single crystal silicon of $\lambda=700\sim900$ nm;

wherein the conversion layer 3 is formed of a nanometered oxygen-contained inorganic phosphor, which is prepared from elements of the chemistry's periodic table, Groups IIIA and IVA that have a cubic crystal structure so that the geometric size of the phosphor is smaller than the wavelength of the light radiated thereon, i.e., $d_{cp)phosphor} < \lambda_{light}$;

wherein the conversion layer 3 has filled therein an ethyl acetoacetate or polycarbonate-based light-transmissive polymer 31 that has evenly distributed therein a phosphor 32 composed of $\alpha$-$Al_2O_3$—$Ti_2O_3$ at the volume concentration of 0.05%~5%;

wherein the conversion layer 3 has added thereto titanium ions as an activator in which the degree of oxidization is $Ti^{+3}$;

wherein the frontal portion of the silicon-based photovoltaic cell 1 has blue-light green color, and the absorption efficiency of the silicon-based photovoltaic cell 1 for grade 1 solar radiation is $\geqq$60~75%;

wherein the conversion layer 3 increases the effective utilization of solar radiation by 15~28%.

Figure 3:
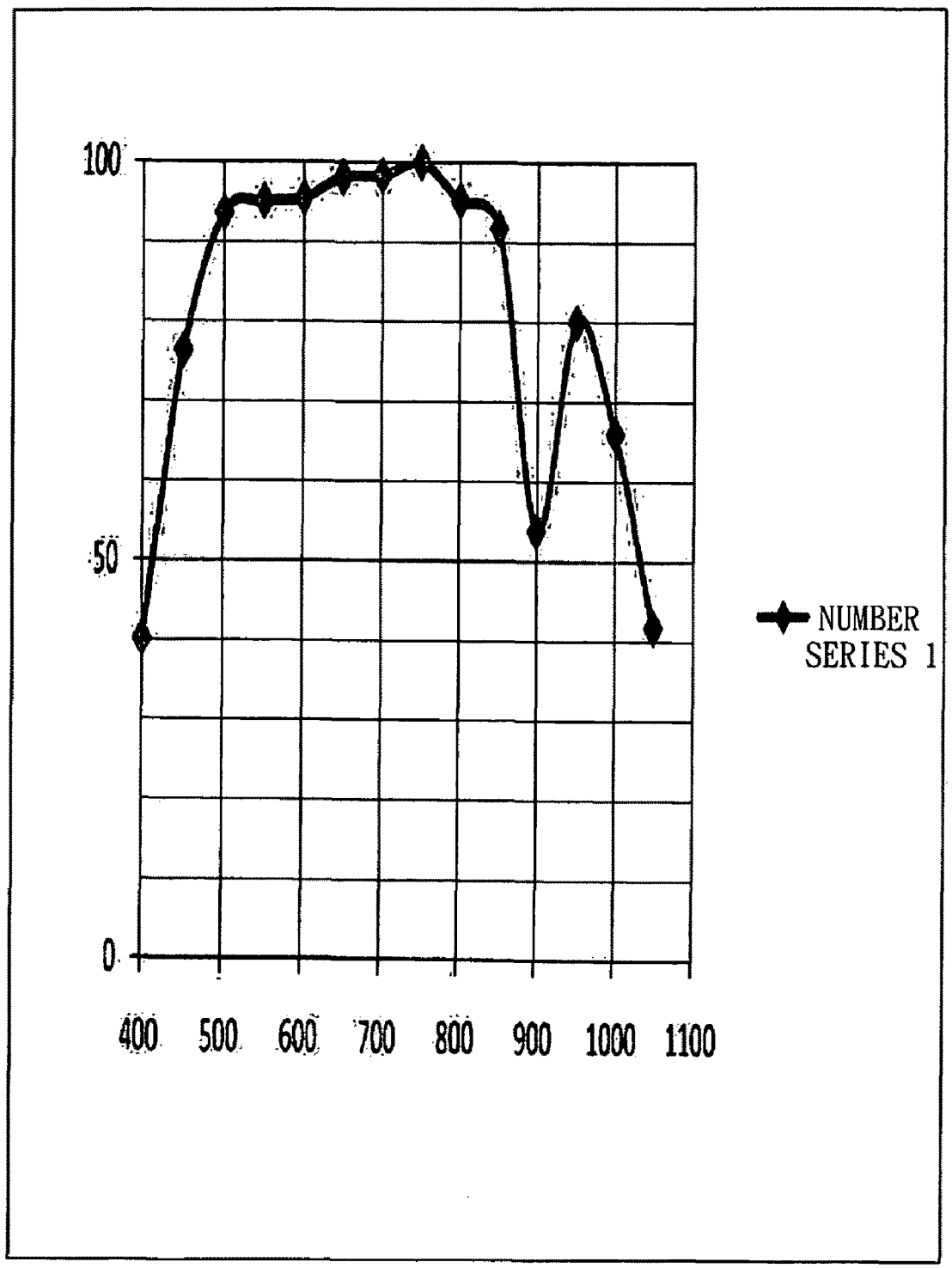
FIG. 3 is a schematic drawing showing a new pattern spectrum obtained subject to the product of a calculation of the two parameters based on the curves shown in Annexed I and Annex II.

Based on the curves of Annex I and Annex II, the invention calculates the product of the two parameters, obtaining a new pattern spectrum as defined in FIG. 3. The new pattern of FIG. 3 shows the solar spectrum that is most bearable to the single crystal type silicon-based photovoltaic cell 1. The maximum value of this new pattern spectrum varies within the range of $\lambda$=780~860 nm. This calculation result indicates the optimal form of a new conversion layer for single-crystal silicon type solar battery.

According to the structure proposed subject to the present invention, the silicon-based photovoltaic battery 1 is composed of the following component parts: the silicon substrate 2 that is set in the housing 5, the anti-reflection glass 4 that is covered over the silicon substrate 2, and the conversion layer 3 that is mounted in the housing 5 for direct contact. The conversion layer 3 has unusual optical properties. At first, the conversion layer 3 strongly absorbs the radiation of the visible solar spectrum of ultraviolet, purple, blue, light blue, green and yellow-green. Secondarily, the materials in the conversion layer 3 emit light after absorption of radiation light, and the maximum value of the emitted light is within the range of $\lambda$=760~780 nm. At last, all the radiation area is within the spectrum subband of $\lambda$=640~920 nm, i.e., in conformity with the optimum efficiency curve of the solar cell panel calculated subject to the present invention (see FIG. 3).

Figure 4:
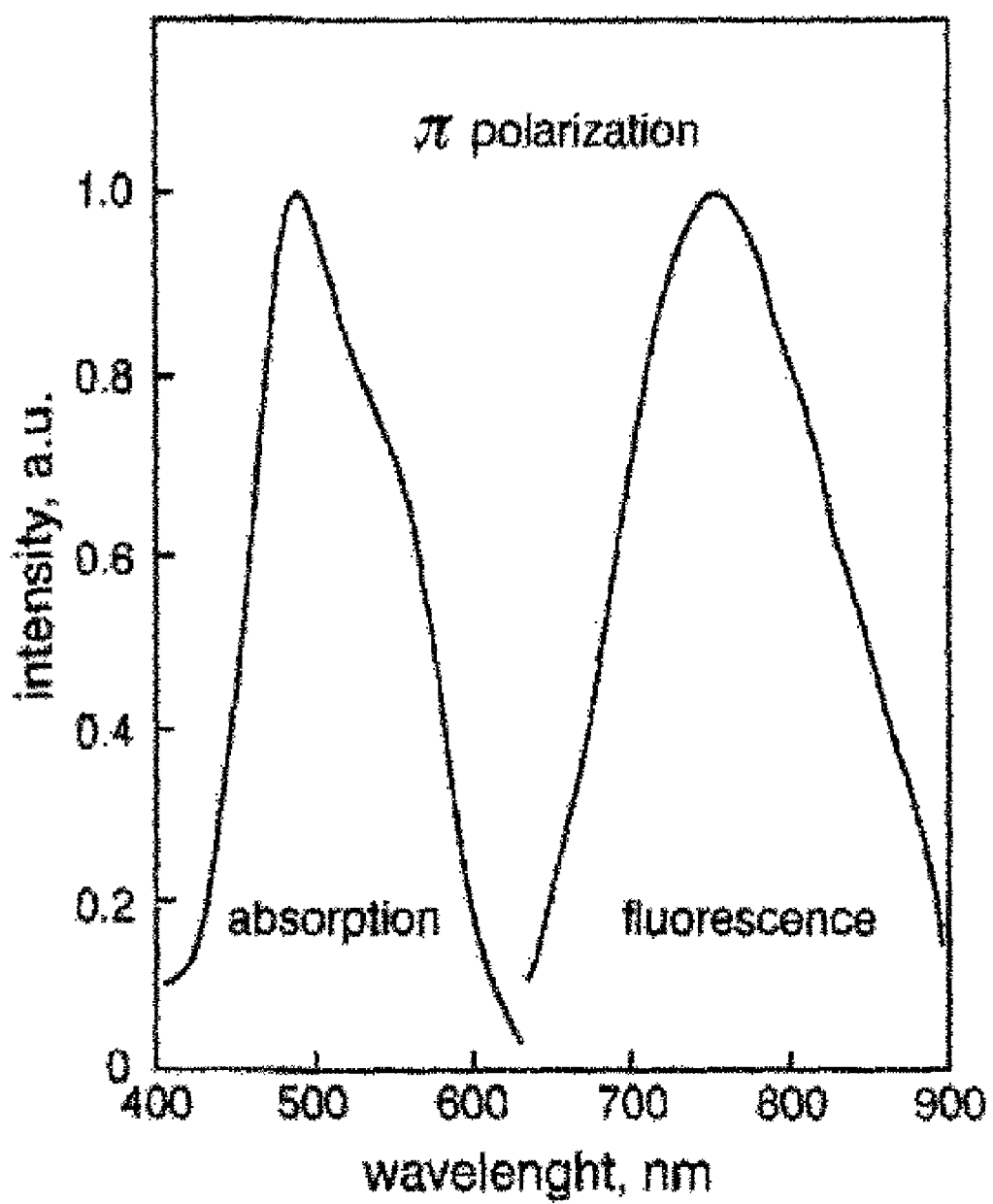
FIG. 4 is a schematic drawing showing the optical-physical properties of a red light conversion layer according to the present invention.

Hereinafter, we explain the maximum value of the absorption spectrum of the conversion layer 3 in conformity with the maximum value of the solar radiation spectrum, i.e., at the area of $\lambda$=470~490 nm. The optical-physical properties of the new conversion layer 3 provided subject to the present invention is shown in FIG. 4, in which the left curve fits the absorption of the first grade solar radiation in the conversion layer, and the right curve fits the broadband luminescence of the materials in the conversion layer at red, dard red and near infrared electromagnetic spectrum.

The silicon-based photovoltaic cell 1 using the said conversion layer 3 has the advantage of raising the efficiency of the photovoltaic cell. This advantage is achieved subject to: the conversion layer is composed of a nanometered, acid-contained inorganic phosphor 32. The phosphor 32 is prepared from elements of the chemistry's periodic table, Groups IIIA and IVA, having a hexagonal crystal structure. Under this condition, the geometric size of the phosphor is smaller than the wavelength of the light radiated thereon, i.e., $d_{cp)phosphor} < \lambda_{light}$. The phosphor 32 is evenly distributed in an ethyl acetoacetate or polycarbonate-based light-transmissive polymer 31 of the conversion layer 3. Further, the volume concentration of conversion layer 3 is 0.05%~5%.

The properties of the conversion layer 3 according to the present invention are described hereinafter. At first, to reduce the optical saturation of the conversion layer 3, the ultra-fine phosphor 32 is filled and distributed in the volume of the polymer 31. During working, we wound that the use of the nanometered phosphor 32 to substitute for conventional micrometered (or greater size) phosphor effectively improves the optical transmission properties of the conversion layer 3. The physical explanations are as follows:

Firstly, it has a ultra-fine power medium of size smaller than the excitation wavelength or the wavelength of its radiation and, its follows the dispersion rule. According to Rayleigh's law, the scattering of light or other electromagnetic radiation by particles is much smaller than the wavelength of the light. The conversion layer of the invention is in conformity with Rayleigh's law, and its scattering value is proportional to the area of the dispersed particles.

Secondarily, the nanometered phosphor 32 is an oxygen-contained inorganic phosphor prepared from elements of Groups IIIA and IVA.

In the third place, the nanometered phosphor 32 has of the architecture of $\alpha Al_2O_3$, i.e., hexagonal crystal structure. It is to be understood that the geometric size of the inorganic phosphor 32 is smaller than the wavelength of the light radiated thereon, i.e., $d_{50)phosphor} < \lambda_{light}$ and $d_{cp)phosphor} < \lambda_{light}$.

In the fourth place, the nanometered phosphor 32 is evenly distributed in the volume of the polymer 31 such that particles are spaced from one another at a distance that is 100~150 times over the geometric size of the phosphor, i.e., about 25~50 nm. Within the range of 50 nm (or smaller), one radiation particle of the phosphor 32 is not abutted against the others.

In the fifth place, the distribution of the phosphor 32 is even, about 0.05~5% of the volume of the conversion layer 3. If the volume concentration of the phosphor 32 is smaller than 0.05%, the luminescence of the radiation on the phosphor has a low brightness. Low luminescent brightness cannot raise solar cell efficiency physically. When the volume concentration of the phosphor 32 is increased to a relatively higher lever, for example, greater than 5%, the intensity of the photoluminescence drops from its maximum value. When the volume concentration of the phosphor 32 is at an optimum level, the photoluminescence reaches the maximum value, and this value is 0.2~1.5% as discovered by the present invention.

Therefore, we make sure of the main optical-physical parameters of the conversion layer 3 of the silicon-based photovoltaic cell 1. It is to be understood that, when compared with a conventional standard solar energy converter, the silicon-based photovoltaic cell of the present invention has substantially enhanced parameters. According to the present invention, the voltage range is increased to 5.6V, i.e., increased by 20~25%, the short-circuit current is increased, and the unit area silicon-based photovoltaic cell 1 has a relatively higher power. These are the important features of the present invention.

The aforesaid features of the silicon-based photovoltaic cell 1 of the present invention come from its physical properties. The conversion layer 3 is prepared from an $\alpha$-$Al_2O_3$-based phosphor 32 having added thereto activating ions-titanium ions of oxygen of which the degree of oxidization is $Ti^{+3}$.

The technical process of the present invention includes the use of $\alpha$-$Al_2O_3$ and $Ti^{+3}$. With respect to aluminum oxide, known crystal types include $\xi$-$Al_2O_3$, $\delta$-$Al_2O_3$ and $\alpha$-$Al_2O_3$. The mixture of $\xi$-$Al_2O_3$ and $\delta$-$Al_2O_3$ has an oblique-angled and monoclinal structure and a low density $P_\xi$=3.5 g/cm$^3$. With respect to $\xi$-$Al_2O_3$, it has high lattice parameters, therefore the internal static electric field of $\xi$-$Al_2O_3$ is not strong. With respect to $\alpha$-$Al_2O_3$, this material has the density increased by 12~15%, determining a high static electric field therein. The activation of $Ti^{+3}$ accompanies reduction of $(TiO_2)+4$ value chain, as illustrated, $(1-x)Al_2O_3+xTiO_2 \rightarrow (H_2) \rightarrow (1-x)Al_2O_3+xTi_2O_3+H_2O \rightarrow Al_{2-x}Ti_xO_3+H_2O$.

According to equal value mechanism, the position $Ti^{+3}$ in $Al_2O_3$ is altered, forming inorganic solid solutions of $Ti_2O_3$ and $\alpha$-$Al_2O_3$ subject to a predetermined concentration arrangement. The invention discovered that when the concentration $[Ti_2O_3]>5\%$, the follow-up solid solution is distributed in $\alpha$-$Al_2O_3$ in two ways: $Ti_2O_3$ dissolved in $Al_2O_3$ and $Al_2O_3$ dissolved in $Ti_2O_3$. Therefore, it is practical to add $Ti_2O_3$ to $Al_2O_3$. Further, when the concentration of $Ti_2O_3$ in $\alpha$-$Al_2O_3$ is changed, the brightness of the photoluminescence changes in such a manner that: the brightness is increased proportionally at the initial stage subject to the concentration of the added $Ti_2O_3$, and starts to drop after saturation of the concentration. The optimum concentration value is determined subject to the maximum value of the luminescent brightness of the phosphor 32. At this time, the concentration of $\alpha$-$Al_2O_3$—$Ti_2O_3$ is 0.5~2.5% mass fraction. For the simplest alternate form of this process, the invention made an experiment using a solid-phase compound sintering technique, $Al_2O_3+Ti_2O_3 \rightarrow (H_2-N_2) \rightarrow Al_2O_3-Ti_2O_3$. The compound is the original nanometered $Al_2O_3+Ti_2O_3$ powder. A more complicated synthesis procedure may be employed, for example, $Al_2(SO_4)_3+TiOSO_4+4NH_4OH \rightarrow Al(OH)_3+Ti(OH)_4+4(NH_4)_2SO_4$. Thereafter a sintering procedure is employed to sinter the sedimented hydroxide compound in the reduced medium.

The invention also indicated that $Ti^{+3}$ has a relatively greater ionic radius when compared to $Al^{+3}$ ($\tau_{Al}$=0.58 Å). Because of this reason, when the mixture of $\xi$-$Al_2O_3$ and $Ti_2O_3$ is receiving a heat treatment, $\alpha$-$Al_2O_3$ is rubblized. If the conventional $\alpha$-$Al_2O_3$ is synthesized from $\xi$-$Al_2O_3$, the average particle size will be $d_{50} \approx 0.65$ μm. When the average particle size is reduced to the level $d_{50} \approx 0.48$~0.50 μm, $Ti_2O_3$ causes activation. Thus, from the point of view of increase of the dispersivity of the phosphor 32 prepared according to the present invention, titanium ion is the direct factor that causes activation of $Al_2O_3$. At this time, the powder shape is mainly in the form of a strip or needle, forming a sharp angle of prism and a notch.

Internal d-d transition determines strong photoluminescence of $Ti^{+3}$. Under the effect of d-d transition, radiation and absorption of $Ti^{+3}$ causes an effect on the static electric field of $\alpha$-$Al_2O_3$ lattice. Therefore, a conclusion can be made subject to FIG. 4 that the absorption of $Ti^{+3}$ shows a bell-shaped form. The radiation pattern of $\alpha$-$Al_2O_3$—$Ti_2O_3$ phosphor 32 has a great halfwave width. The invention also indicates that the duration of the afterglow of this radiation is short, i.e., $\tau_e \approx 20$ μs. When in the temperature range 320~450K, this short duration of afterglow makes no change. This is an important feature of the phosphor 32 of the present invention because the silicon-based photovoltaic cell and its internal conversion layer 3 can be directly heated to a high temperature, i.e., T>0~60° C.

When compared the silicon-based photovoltaic cell 1 having the said conversion layer 3 with conventional solar cells, the following Table 1 is obtained.

TABLE I

| | Parameter | Single-crystal solar cell of the invention | Prior art standard solar cell |
|---|---|---|---|
| 1 | Total voltage | 54.2~55.2 V | 43.2 V |
| 2 | Optimum voltage | 43.0~43.5 V | 34.4 V |
| 3 | Short-circuit current | 5.85 A | 5 A |
| 4 | Optimum current | 4.65~4.95 A | 3.72 A |
| 5 | Maximum value of power | 165~190 W | 128-152 W |
| 6 | Actual efficiency | 17.2~18% | 14.3% |

From Table 1, a conclusion is obtained that the single-crystal silicon-based photovoltaic cell 1 has higher electric parameter values about 1.2~1.25 times over the values of the standard industrial production module. Subject to these high parameter values, it can be indicated that a silicon substrate made according to the present invention shows an efficiency about 26~28% higher than a standard sample. When making a silicon-based photovoltaic cell by means of using a high resistance silicon device, the growth efficiency will drop to 15~16%, however a relatively higher output voltage will be compensated in the silicon-based photovoltaic cell.

Further, the invention provides a red light conversion layer 3 that absorbs ultraviolet rays, blue-purple or yellow-green light of the Sun's solar radiation and converts the absorption into photoluminescence. The red light conversion layer 3 absorbs the maximum value of the solar radiation so that the maximum value of the photoluminescent spectrum of the red light conversion layer 3 is within the photosensitive spectral zone of the silicon-based photovoltaic cell.

Wherein, the photoluminescence is within the orange, red, near-infrared and mid-infrared subband of electromagnetic spectrum.

Wherein the maximum value of the solar radiation absorbed by the conversion layer is $\lambda$=470~490 nm.

Wherein the red light conversion layer 3 is formed of a nanometered oxygen-contained inorganic phosphor 32, which is prepared from elements of the chemistry's periodic table, Groups IIIA and IVA that have a cubic crystal structure so that the geometric size of the phosphor 32 is smaller than the wavelength of the light radiated thereon, i.e., $d_{cp)phosphor} < \lambda_{light}$.

Wherein the red light conversion layer 3 has filled therein an ethyl acetoacetate or polycarbonate-based light-transmissive polymer 31 that has evenly distributed therein a phosphor 32 composed of $\alpha$-$Al_2O_3$—$Ti_2O_3$ at the volume concentration of 0.05%~5%.

Wherein the red light conversion layer 3 has added thereto titanium ions as an activator of which the degree of oxidization is $Ti^{+3}$.

Wherein the red light conversion layer 3 increases the effective utilization of solar radiation by 15~28%. With respect to the technical features of the red light conversion layer 3 is same as that of the aforesaid silicon-based photovoltaic cell of the present invention, and therefore no further detailed description is necessary in this regard.

In conclusion, the silicon-based photovoltaic cell 1 and its red light conversion layer 3 has the advantages of capable of realizing the creation of high-efficiency silicon-based photovoltaic cells 1, increasing the voltage range of silicon-based photovoltaic cells 1 and the short-circuit current of silicon-based photovoltaic cells 1, and therefore the invention effectively eliminates the drawbacks of conventional silicon-based photovoltaic cells.

Although particular embodiments of the invention have been described in detail for purposes of illustration, various modifications and enhancements may be made without departing from the spirit and scope of the invention.

What is claimed is:

1. A silicon-based photovoltaic cell comprising a single-crystal silicon substrate, a glass covered on said silicon substrate, and a conversion layer sandwiched between said single-crystal silicon substrate and said glass, wherein said conversion layer absorbs ultraviolet rays, blue-purple or yellow-green light of the Sun's solar radiation and converts the absorption into a photoluminescent light; said conversion layer absorbs the maximum value of the Sun's solar radiation so that the maximum value of the photoluminescent spectrum of said conversion layer is within the photosensitive spectral zone of said single-crystal silicon substrate wherein said conversion layer has filled therein an ethyl acetoacetate or polycarbonate-based light-transmissive polymer that has evenly distributed therein a phosphor composed of $\alpha\text{-}Al_2O_3\text{---}Ti_2O_3$ at the volume concentration of 0.05%~5%.

2. The silicon-based photovoltaic cell as claimed in claim 1, wherein said glass is a decolorized frontal glass.

3. The silicon-based photovoltaic cell as claimed in claim 1, wherein said photoluminescent light is within the orange, red, near-infrared and mid-infrared subband of electromagnetic spectrum.

4. The silicon-based photovoltaic cell as claimed in claim 1, wherein the maximum value of the solar radiation absorbed by said conversion layer is $\lambda=470\text{~}490$ nm.

5. The silicon-based photovoltaic cell as claimed in claim 1, wherein the maximum value of the photoluminescent spectrum of said conversion layer is within the photosensitive spectral zone of said single-crystal silicon substrate $\lambda=700\text{~}900$ nm.

6. The silicon-based photovoltaic cell as claimed in claim 1, wherein said conversion layer has added thereto titanium ions as an activator in which the degree of oxidization is $Ti^{+3}$.

7. The silicon-based photovoltaic cell as claimed in claim 1, wherein the frontal portion of the silicon-based photovoltaic cell has blue-light green color, and the absorption efficiency of the silicon-based photovoltaic cell for grade 1 solar radiation is $\geqq 60\text{~}75\%$.

8. The silicon-based photovoltaic cell as claimed in claim 1, wherein said conversion layer increases the effective utilization of solar radiation by 15~28%.

9. A red light conversion layer that absorbs ultraviolet rays, blue-purple or yellow-green light of the Sun's solar radiation and converts the absorption into a photoluminescent light; said conversion layer absorbs the maximum value of the Sun's solar radiation so that the maximum value of the photoluminescent spectrum of said conversion layer is within the photosensitive spectral zone of said single-crystal silicon substrate wherein said conversion layer has filled therein an ethyl acetoacetate or polycarbonate-based light-transmissive polymer that has evenly distributed therein a phosphor composed of $\alpha\text{-}Al_2O_3\text{---}Ti_2O_3$ at the volume concentration of 0.05%~5%.

10. The red light conversion layer as claimed in claim 9, wherein said photoluminescent light is located within the orange, red, near-infrared and mid-infrared subband of electromagnetic spectrum.

11. The red light conversion layer as claimed in claim 9, wherein the maximum value of the solar radiation absorbed by said conversion layer is $\lambda=470\text{~}490$ nm.

12. The red light conversion layer as claimed in claim 9, wherein the maximum value of the photoluminescent spectrum of said conversion layer is within the photosensitive spectral zone of said single-crystal silicon substrate $\lambda=700\text{~}900$ nm.

13. The red light conversion layer as claimed in claim 9, which has added thereto titanium ions as an activator of which the degree of oxidization is $Ti^{+3}$.

14. The red light conversion layer as claimed in claim 9, wherein said conversion layer increases the effective utilization of solar radiation by 15~28%.

* * * * *